US008882565B2

(12) United States Patent
Schwandner et al.

(10) Patent No.: US 8,882,565 B2
(45) Date of Patent: *Nov. 11, 2014

(54) METHOD FOR POLISHING A SEMICONDUCTOR WAFER

(75) Inventors: Juergen Schwandner, Garching (DE); Roland Koppert, Triftern (DE)

(73) Assignee: Siltronic AG, Munich (DE)

( * ) Notice: Subject to any disclaimer, the term of this patent is extended or adjusted under 35 U.S.C. 154(b) by 767 days.

This patent is subject to a terminal disclaimer.

(21) Appl. No.: 13/042,587

(22) Filed: Mar. 8, 2011

(65) Prior Publication Data

US 2011/0244760 A1 Oct. 6, 2011

(30) Foreign Application Priority Data

Mar. 31, 2010 (DE) .......................... 10 2010 013 519

(51) Int. Cl.
*B24B 1/00* (2006.01)
*H01L 21/02* (2006.01)
*B24B 37/005* (2012.01)

(52) U.S. Cl.
CPC ...... *B24B 37/0056* (2013.01); *H01L 21/02024* (2013.01)
USPC ................................ 451/41; 451/56; 438/691

(58) Field of Classification Search
CPC .... B24B 37/04; B24B 37/042; B24B 37/044; B24B 37/08; B24B 37/0056; H01L 21/02024
USPC .......................... 451/41, 56, 63; 438/691–693
See application file for complete search history.

(56) References Cited

U.S. PATENT DOCUMENTS

| | | | |
|---|---|---|---|
| 5,152,917 A | 10/1992 | Pieper | |
| 6,019,806 A * | 2/2000 | Sees et al. ........................ | 51/308 |
| 6,069,080 A | 5/2000 | James | |
| 6,080,673 A | 6/2000 | Ko et al. | |
| 6,114,248 A | 9/2000 | Gambino et al. | |
| 6,299,514 B1 | 10/2001 | Boller | |
| 6,416,393 B2 | 7/2002 | Fabry | |
| 6,918,821 B2 * | 7/2005 | Balijepalli et al. .............. | 451/41 |
| 2001/0036797 A1 * | 11/2001 | Fabry et al. ...................... | 451/41 |
| 2003/0104698 A1 * | 6/2003 | Taniguchi et al. ............ | 438/692 |
| 2005/0020188 A1 | 1/2005 | Saito et al. | |
| 2005/0101227 A1 * | 5/2005 | Balijepalli et al. .............. | 451/41 |
| 2005/0227590 A1 | 10/2005 | Sung | |
| 2007/0197035 A1 | 8/2007 | Morita et al. | |
| 2008/0113509 A1 | 5/2008 | Sakairi et al. | |
| 2009/0029552 A1 | 1/2009 | Schwandner | |
| 2009/0124175 A1 | 5/2009 | Ueno et al. | |
| 2009/0298397 A1 | 12/2009 | Yamada et al. | |
| 2010/0048375 A1 * | 2/2010 | Horie et al. ...................... | 501/11 |
| 2010/0144149 A1 * | 6/2010 | Ward et al. .................... | 438/693 |
| 2011/0183582 A1 * | 7/2011 | Schwandner et al. .......... | 451/41 |
| 2011/0244760 A1 * | 10/2011 | Schwandner et al. .......... | 451/36 |
| 2011/0244762 A1 * | 10/2011 | Schwandner et al. .......... | 451/41 |

FOREIGN PATENT DOCUMENTS

| | | |
|---|---|---|
| DE | 10007390 A1 | 10/2000 |
| DE | 10018338 C1 | 8/2001 |
| DE | 10122283 A1 | 8/2002 |
| DE | 102007035266 A1 | 1/2009 |
| JP | 11111653 A | 4/1999 |
| JP | 11330024 A | 11/1999 |
| JP | 2001303027 A | 10/2001 |
| JP | 2002231662 A | 8/2002 |
| JP | 2003257905 A | 9/2003 |
| JP | 2004071833 A | 3/2004 |
| JP | 2005007520 A | 1/2005 |
| JP | 2005534170 A | 11/2005 |
| JP | 2007021680 A | 2/2007 |
| JP | 2007512966 A | 5/2007 |
| JP | 2007220974 A | 8/2007 |
| JP | 2008036783 A | 2/2008 |
| JP | 2009125873 A | 6/2009 |
| JP | 2009285768 A | 12/2009 |
| JP | 201034479 A | 2/2010 |
| KR | 1019980082476 A | 12/1998 |
| KR | 1019990066842 A | 8/1999 |
| WO | WO 92/13680 A1 | 8/1992 |
| WO | WO 2004009289 A2 | 1/2004 |
| WO | WO 2005046935 A1 | 5/2005 |

OTHER PUBLICATIONS

Kimura et al. *A New Method for the Precise Measurement of Wafer Roll off of Silicon Polished Wafer*, Japanese. Journal of Applied Physics vol. 38 (1999), pp. 38-39.

* cited by examiner

*Primary Examiner* — Maurina Rachuba
(74) *Attorney, Agent, or Firm* — Leydig, Voit & Mayer, Ltd.

(57) ABSTRACT

A method of polishing a semiconductor wafer includes applying a polishing pad to the semiconductor wafer so as to subject the semiconductor wafer to a polishing process and supplying an aqueous polishing agent solution between the polishing pad and the semiconductor wafer. The polishing pad includes fixedly bonded abrasives of $SiO_2$ with an average grain size in a range of 0.1 to 1.0 μm. The aqueous polishing agent solution comprising an alkaline component, being free of solid materials and having a variable pH value in a range of 11 to 13.5. The aqueous polishing agent solution is maintained at a pH value of less than 13 during the polishing process and the pH value of the aqueous polishing agent solution is increased to a range of 13 to 13.5 so as to end the polishing process.

10 Claims, No Drawings

METHOD FOR POLISHING A SEMICONDUCTOR WAFER

CROSS REFERENCE TO RELATED APPLICATIONS

This application claims priority from German Patent Application No. DE 10 2010 013 519.4, filed Mar. 31, 2010, which is hereby incorporated by reference herein in its entirety.

FIELD

The invention relates to a method for polishing a semiconductor wafer.

BACKGROUND

Conventionally, after grinding, cleaning and etching steps, the surface(s) of the semiconductor wafers is (are) smoothed by removal polishing.

In the case of single-side polishing (SSP), semiconductor wafers are held during processing on the rear side on a support plate using cement, by means of vacuum or by means of adhesion.

In the case of double-side polishing (DSP), semiconductor wafers are introduced loosely into a thin carrier and are polished on the front and rear sides simultaneously in a manner "floating freely" between an upper and a lower polishing plate covered with a polishing pad. This polishing method is effected with supply of a polishing agent slurry containing abrasives, normally in general on the basis of a silica sol.

A suitable double-side polishing machine is described in DE 100 07 390 A1, which is hereby incorporated by reference herein.

In the case of chemical mechanical polishing (CMP), which, by contrast, comprises a final polishing only of the front side ("component side") using a softer polishing pad as so-called haze-free polishing ("finishing"), abrasives are likewise supplied in the form of a polishing agent slurry.

The semiconductor wafer to be polished is usually a silicon wafer or a substrate having layer structures derived from silicon (e.g. silicon-germanium). Said silicon wafers are used in particular for producing semiconductor components such as memory chips (DRAM), microprocessors, sensors, light emitting diodes and many more.

The requirements made of silicon wafers for fabricating, in particular, memory chips and microprocessors are becoming more stringent. This concerns firstly the crystal properties themselves (e.g. with regard to the defect densities, internal getters for trapping metallic impurities), but in particular also the geometry and the flatness of the wafer. A silicon wafer having two perfectly plane-parallel sides, excellent flatness in particular on that side of the silicon wafer on which components are to be fabricated, and low surface roughness would be desirable. It would furthermore be desirable to be able to utilize the entire area of the component side, which is currently not possible on account of a decrease in thickness at the edge of the wafer and poor geometry in the edge region.

It is known that the conventional methods for polishing semiconductor wafers are responsible for this edge roll-off.

The edge geometry is usually quantified by specifying one or more edge roll-off parameters which usually relate to the total thickness of a silicon wafer or to the edge geometry of its front and/or rear side and which can be used to characterize the customarily observed decrease in the thickness of the silicon wafer in its edge region or the flatness of front and/or rear side of the silicon wafer likewise in its edge region. A method for measuring the edge roll-off of silicon wafers is described in Jpn. J. Appl. Phys. Vol. 38 (1999), pp. 38-39.

The polishing of semiconductor wafers by means of "Fixed Abrasive Polishing" (FAP) is furthermore known, in which the semiconductor wafer is polished on a polishing pad containing an abrasive material bonded in the polishing pad ("fixed-abrasive pad").

A polishing step in which such an FAP polishing pad is used is referred to hereinafter for short as an FAP step.

DSP and CMP differ from FAP in particular by virtue of the fact that in DSP and CMP the polishing pad comprises no abrasives and abrasives are always supplied in the form of a polishing agent slurry.

The German patent application DE 10 2007 035 266 A1 describes a method for polishing a substrate composed of silicon material, comprising two polishing steps of the FAP type, which differ in that, in one polishing step, a polishing agent slurry containing non-bonded abrasive material as solid material is introduced between the substrate and the polishing pad, while in the second polishing step the polishing agent slurry is replaced by a polishing agent solution that is free of solid materials.

SUMMARY

An aspect of the present invention is to provide an alternative polishing method which is advantageous with regard to the edge geometry of the polished semiconductor wafer.

In an embodiment, the present invention provides a method of polishing a semiconductor wafer includes applying a polishing pad to the semiconductor wafer so as to subject the semiconductor wafer to a polishing process and supplying an aqueous polishing agent solution between the polishing pad and the semiconductor wafer. The polishing pad includes fixedly bonded abrasives of SiO2 with an average grain size in a range of 0.1 to 1.0 µm. The aqueous polishing agent solution comprising an alkaline component, being free of solid materials and having a variable pH value in a range of 11 to 13.5. The aqueous polishing agent solution is maintained at a pH value of less than 13 during the polishing process and the pH value of the aqueous polishing agent solution is increased to a range of 13 to 13.5 so as to end the polishing process.

DETAILED DESCRIPTION

The invention provides an FAP polishing process using $SiO_2$ abrasives incorporated in the pad.

A polishing agent solution that is free of solid materials is supplied during the polishing process.

The polishing agent solution is an aqueous solution containing an alkaline component.

The polishing agent solution preferably comprises deionized water with the purity customary in the semiconductor industry.

The polishing agent solution during the polishing of the semiconductor wafer preferably comprises compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof as alkaline component.

The proportion of the stated compounds in the polishing agent solution is preferably 0.01 to 10% by weight, particularly preferably from 0.01 to 0.2% by weight.

The use of potassium carbonate is especially preferred.

In an embodiment, the pH value of the polishing agent solution is at least 11 and at most 13.5.

The polishing agent solution can furthermore contain one or more further additives, for example surface-active additives such as wetting agents and surfactants, stabilizers acting as protective colloids, preservatives, biocides, alcohols and complexing agents.

In the method according to the invention, a polishing pad containing $SiO_2$ bonded in the polishing pad (FA pad) is used during the polishing process.

The polishing pad can have a surface topography shaped by replicated microstructures. These microstructures ("posts") can have for example the form of columns having a cylindrical or polygonal cross section or the form of pyramids or truncated pyramids.

More detailed descriptions of such polishing pads are contained for example in WO 92/13680 A1 and US 2005/227590 A1, which are hereby incorporated by reference herein in their entirety.

The average particle size of $SiO_2$ abrasives contained in the FAP polishing pad is preferably 0.1-1.0 µm, particularly preferably 0.1-0.6 µm, and especially preferably 0.2-0.4 µm.

In an embodiment, polishing agent slurries as in the conventional methods of DSP and CMP or some FAP methods are not supplied.

The pH value of the polishing agent solution is variable during the performance of the method.

The pH value is regulated by an alkaline component containing potassium carbonate and/or one of the other compounds mentioned above.

Provision is made for controlling the polishing removal exclusively by way of the alteration of the pH value of the polishing agent solution.

The invention can be implemented as single-side polishing.

It is likewise preferred to carry out polishing of both sides of the semiconductor wafer simultaneously.

It is preferred to change the pH value of the polishing agent solution during the polishing pass in such a way as to result in a semiconductor wafer that is flat without wedge shape differences or wafer edge unevennesses (e.g. edge roll off). This is effected by corresponding supply of the alkaline component of the polishing agent solution.

The pH value of the polishing agent solution is preferably controlled by means of suitable polishing agent supply in a locally delimited fashion on the respective polishing plates and/or pads. This makes it possible to supply polishing agent solution having a locally different pH value.

Thus, by way of example the pH value of the polishing agent solution supplied in an outer region of the semiconductor wafer (edge region) could be chosen to be approximately 11.5 to approximately 12 in order to achieve a maximum removal rate in the edge region of the semiconductor wafer, while a polishing agent solution having a significantly higher pH value is supplied in other regions, e.g. in an inner zone, of the semiconductor wafer.

Through local supply of polishing agent solution having a pH of approximately 13-13.5, it is even conceivable to reduce the polishing locally to almost zero.

In conjunction with the $SiO_2$-FA pad, minimal removal rates—virtually 0 µm/min—arise at a pH value of approximately 13 to 13.5.

Maximal removal rates are obtained for a pH value in the range of approximately 11.5 to approximately 12.

The prevailing temperature is dependent on a number of parameters. Inter alia—besides the chemical reaction (pH value)—the polishing pressure, the FA pad itself (friction), the amount of polishing agent supplied, etc. play a part.

The polishing according to the invention is preferably effected in a temperature range of between approximately 25° C. and approximately 41° C.

A temperature of approximately 28° C. to approximately 37° C. results given a polishing pressure of 270 hPA as reference pressure. Maximal removal rates can be obtained in a pH value range of 11.5 to 12 and with a temperature of greater than or equal to 31° C.

Starting from the point in time of stopping polishing, that is to say starting from the point in time at which the pH value is increased to greater than or equal to 13, the polishing temperature decreases significantly. In the case of polishing with a polishing pressure of 270 hPA, by way of example, the polishing temperature decreases by approximately 1.5° C. over a time duration of 1 min.

At higher polishing temperatures, for example in the case of polishing processes at higher polishing pressures (e.g. 400 hPa) the temperature decrease is even more pronounced (more than 5° C. temperature reduction after just 15 sec).

An advantage of the method according to the invention is that the pH value of an alkaline polishing agent solution having the above-described composition (ideally: potassium carbonate or, for pH values of greater than or equal to 12, mixtures of potassium carbonate and potassium hydroxide) can be varied very well and exactly in a range of 11-13.5.

In the method according to the invention, the polishing with variation of the removal rate is preferably effected whilst keeping other polishing parameters constant, such as polishing pressure, retainer ring and zone pressures, polishing kinematics (rotational speeds), amount and type of polishing agent, externally set (plate) temperatures.

On account of the unusual property described above, the $SiO_2$ FA pad in conjunction with alkaline polishing agent solution having a pH of greater than or equal to 11 is appropriate for a polishing process regulated in respect of the rate of removal in conjunction with constant process management of the polishing parameters that have a mechanical effect.

With a typical CMP polishing process this would not be possible on account of the instability of the silica sol in this pH value range (in particular at pH values of greater than 12.5) as a result of gellation of the sol as a result of aggregation of the sol particles at high pH values with downstream problems such as scratch formation, defect generation (incipient etching) on the wafer surface, contamination and encrustation of the polishing agent lines, blockage of the filter units.

The effect of the alkaline loading, growth and aggregation of the $SiO_2$ particles takes place in the case of the $SiO_2$ FA pad on the polishing pad surface itself, depending on which pH value is employed during polishing.

However, the comparatively hard FA pad can rapidly regenerate again since it does not store the polishing agent in the pad and, in contrast to DSP and CMP, no "clumped" polishing agent slurry is moved in the process or in the installation.

The pH value of the polishing agent solution therefore lies in a range of 11 to approximately 13.5 and is varied by corresponding addition of the stated compounds in this pH value range. The proportion of the stated compounds such as potassium carbonate, for example, in the polishing agent solution is preferably 0.01 to 10% by weight, particularly preferably from 0.01 to 0.2% by weight.

It is especially preferred to combine the good removal rate in the range of approximately 11.5 to approximately 12 with the fact that the material removal decreases to virtually zero starting from a pH value of 13.

For this purpose, preferably, in a first step of the polishing process, which can be configured as single-side or double-side polishing, a polishing agent solution having the abovementioned composition with a pH of 11 to less than 13, in particular 11 to 12.5, is supplied, the range of approximately 11.5 to approximately 12 being particularly preferred.

After the desired material removal has been reached, the polishing process is stopped in a second step by virtue of the fact that—unlike in the prior art, which usually involved virtually mechanical retardation by the addition of additives that modify the viscosity of the polishing agent—the pH value of the polishing agent solution is increased by the alkaline component being increased to at least 13, ideally approximately 13.5.

The polishing process is therefore stopped by the variation of the pH value of the polishing agent solution.

For some applications it is advantageous to add in a third step, in turn, a polishing agent solution having a pH value of less than or equal to 11.5. If the FA polishing using $SiO_2$ abrasives is intended to be followed by a conventional polishing with supply of a polishing agent slurry, such a step serves to prepare for the slurry polishing.

Said slurry polishing is then effected on the same polishing pads containing $SiO_2$ abrasives. This, too, can again involve single-side polishing (e.g. CMP) or simultaneous double-side polishing of the semiconductor wafer such as DSP. Instead of the polishing agent solution, a polishing agent slurry comprising abrasives of oxides of an element selected from the group consisting of silicon, aluminum and cerium is supplied during slurry polishing.

The slurry polishing preferably comprises two steps.

A polishing agent slurry having the abovementioned composition with an average size of the abrasives of 10-30 nm is supplied in a first step and a polishing agent slurry having said composition with an average size of the abrasives of 35-50 nm is supplied in a second step. The pH value of the slurry is preferably less than or equal to 11.5.

The method according to the invention has diverse application possibilities and advantages.

It is possible, through corresponding regulation of the pH value of the locally supplied polishing agent solution, to control the material removal locally in situ in order to improve the geometry and nanotopology of the semiconductor wafer.

By increasing the pH value of the polishing agent solution to approximately 13 to 13.5, it is possible to stop the polishing process, which leads to geometry and nanotopology improvements and optimization of the wafer surface.

The method is preferably employed in single-side polishing, the rear side of the semiconductor wafer being held by means of a wafer holding system (template, carrier).

Sequential application to the front and rear sides of the semiconductor wafer results in a semiconductor wafer polished on both sides. Since the material removal can be controlled locally, the two sequential polishing processes can be coordinated with one another in a targeted manner.

Simultaneous double-side polishing with lapping kinematics or planetary kinematics using $SiO_2$ polishing pads and an alkaline polishing agent solution is also preferred. In this case, the semiconductor wafers lie in cutouts in carriers which are caused to rotate by means of an inner and an outer toothed ring and the semiconductor wafer is moved on a cycloidal trajectory.

In the context of the invention, double-side polishing with orbital kinematics is particularly preferred when polishing semiconductor wafers having a diameter of 450 mm. Orbital kinematics means that the semiconductor wafer lies in a cutout in a wafer holding system which is moved on a circular path, but—in contrast to planetary kinematics—does not rotate about its own axis.

In the case of orbital polishing methods with relatively small polishing plates there is the risk of global wedge shape problems of the wafers since the polishing kinematics bring about larger local removal differences in comparison with polishing methods with planetary kinematics and relatively large polishing plates. This disadvantage can be suppressed by locally differently coordinated pH values of the polishing medium.

It is especially preferred to combine the regulation of the material removal with an in-situ measurement of the wafer thickness in order to influence the geometry of the wafer in a targeted manner. This can largely be automated since, with the exception of the pH value of the polishing agent solution, all the other process parameters can be kept constant.

Thus, the present invention differs from DE 102 007 035 266 A1, which employs FAP with polishing agents in the alkaline range of pH 10-12, and thus necessarily provides two FAP polishing processes, once with and once without polishing agent containing abrasives, on one and the same side of the semiconductor wafer. In contrast, the method according to embodiments of the present invention takes place without polishing agents comprising abrasives.

A two-stage FAP, embodied as sequential polishing of the rear and front sides, by means of a polishing pad comprising fixedly bonded $SiO_2$ abrasives, is especially preferred.

In this case, the two polishing processes, that is to say the rear side polishing and the front side polishing, can be coordinated with one another, such that targeted influencing of the wafer geometry and wafer nanotopology, especially in the wafer edge region, can be performed.

Both sides of the semiconductor wafer are polished by means of $SiO_2$ polishing pads with supply of a polishing agent solution having a pH value of at least 11, preferably at least 11.2, and especially preferably at least 11.5.

The method according to the invention leads to an improvement in the geometry in the outer edge region of the semiconductor wafer, in particular in a range of a distance of less than or equal to 10 mm, particularly preferably in the range of less than or equal to 5 mm with respect to the edge of the semiconductor wafer.

In principle, the semiconductor wafers are pressed by the side surface to be polished against the polishing pad lying on a polishing plate, with the aid of a polishing head.

A polishing head also includes a retainer ring which laterally encloses the substrate and prevents it from sliding from the polishing head during polishing.

In the case of modern polishing heads, that side surface of the silicon wafer which is remote from the polishing pad lies on an elastic membrane that transmits the polishing pressure exerted. The membrane is part of a possibly subdivided chamber system that forms a gas or liquid cushion.

However, polishing heads are also used in the case of which an elastic support ("backing pad") is used instead of a membrane.

In this case, the polishing head can additionally also be moved translationally over the polishing pad, whereby a more comprehensive utilization of the polishing pad area is obtained.

Furthermore, the method according to the invention can equally be carried out on single-plate and multi-plate polishing machines.

The use of multi-plate polishing machines having preferably two, especially preferably three, polishing plates and polishing heads is preferred.

By way of example, the polishing machine AC2000 from Peter Wolters, Rendsburg (Germany) is suitable for carrying out the double-side polishing of the semiconductor wafer according to embodiments of the invention.

Said polishing machine is equipped with pin interlocking of the outer and inner rings in order to drive the carriers. The apparatus can be designed for one or more carriers. Owing to the higher throughput, an apparatus for a plurality of carriers is preferred, such as is described for example in DE-100 07 390 A1 and in which the carriers move on a planetary path around the center of the apparatus. The apparatus includes a lower and an upper polishing plate, which are freely rotatable horizontally and are covered with a polishing pad. During the polishing, the semiconductor wafers are situated in the cutouts in the carriers and between the two polishing plates, which rotate and exert a specific polishing pressure on them while a polishing agent solution having a pH of 11-13.5 is continuously supplied. In this case, the carriers are also set in motion, preferably by means of rotating pin rings which engage in teeth on the circumference of the carriers.

While the invention has been particularly shown and described with reference to preferred embodiments thereof, it will be understood by those skilled in the art that various changes in form and details may be made therein without departing from the spirit and scope of the invention.

What is claimed is:

1. A method of polishing a semiconductor wafer comprising:
   applying a polishing pad to the semiconductor wafer so as to subject the semiconductor wafer to a polishing process, the polishing pad including fixedly bonded abrasives of $SiO_2$ with an average grain size in a range of 0.1 to 1.0 μm;
   supplying an aqueous polishing agent solution between the polishing pad and the semiconductor wafer, the aqueous polishing agent solution comprising an alkaline component, being free of solid materials and having a variable pH value in a range of 11 to 13.5;
   maintaining the aqueous polishing agent solution at a pH value of less than 13 during the polishing process; and
   increasing the pH value of the aqueous polishing agent solution to a range of 13 to 13.5 so as to end the polishing process.

2. The method recited in claim 1, wherein the alkaline component includes at least one compound from the group consisting of sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH).

3. The method recited in claim 1, wherein a single side of the semiconductor wafer is subjected to the polishing process.

4. The method recited in claim 1, wherein both sides of the semiconductor wafer are successively subjected to the polishing process.

5. The method recited in claim 1, wherein both sides of the semiconductor wafer are simultaneously subjected to the polishing process.

6. The method recited in claim 5, wherein relative movement of the polishing pad and the semiconductor wafer during the polishing process is provided by a polishing machine using planetary kinematics.

7. The method as recited in claim 5, wherein relative movement of the polishing pad and the semiconductor wafer during the polishing process is provided by a polishing machine using orbital kinematics.

8. The method as recited in claim 1, wherein the aqueous polishing agent solution has a pH value in a range of approximately 11.5 to approximately 12 during the polishing process.

9. A method of polishing a semiconductor wafer comprising:
   applying a polishing pad to the semiconductor wafer so as to subject the semiconductor wafer to a polishing process, the polishing pad including fixedly bonded abrasives of $SiO_2$ with an average grain size in a range of 0.1 to 1.0 μm;
   supplying an aqueous polishing agent solution between the polishing pad and the semiconductor wafer, the aqueous polishing agent solution comprising an alkaline component, being free of solid materials and having a variable pH value in a range of 11 to 13.5;
   maintaining the aqueous polishing agent solution at a pH value of less than 13 during the polishing process; and
   increasing the pH value of the aqueous polishing agent solution to a range of 13 to 13.5 so as to end the polishing process,
   wherein, during the polishing process, the thickness of the semiconductor wafer is measured and the pH value of the aqueous polishing agent solution is regulated based on the measured thickness profile determined.

10. The method as recited in claim 9, wherein the supplying the aqueous polishing agent solution includes supplying a first composition of aqueous polishing agent solution having a first pH value between an inner region of a surface of the semiconductor wafer and the polishing pad and supplying a second composition of aqueous polishing agent solution having a second pH value, different than the first pH value, between an outer region of the surface of the semiconductor wafer and the polishing pad.

* * * * *